(12) United States Patent
Haseno et al.

(10) Patent No.: US 9,847,813 B2
(45) Date of Patent: Dec. 19, 2017

(54) FEED UNIT AND FEED SYSTEM FOR NON-CONTACT POWER TRANSMISSION

(71) Applicant: SONY CORPORATION, Minato-ku (JP)

(72) Inventors: Shinichi Haseno, Kanagawa (JP); Yoichi Uramoto, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 621 days.

(21) Appl. No.: 14/345,565

(22) PCT Filed: Oct. 12, 2012

(86) PCT No.: PCT/JP2012/076405
§ 371 (c)(1),
(2) Date: Mar. 18, 2014

(87) PCT Pub. No.: WO2013/058177
PCT Pub. Date: Apr. 25, 2013

(65) Prior Publication Data
US 2014/0346890 A1    Nov. 27, 2014

(30) Foreign Application Priority Data

Oct. 21, 2011 (JP) .................................. 2011-231767
Apr. 16, 2012 (JP) .................................. 2012-092846

(51) Int. Cl.
*H01F 37/00* (2006.01)
*H01F 38/00* (2006.01)
(Continued)

(52) U.S. Cl.
CPC ............ *H04B 5/0037* (2013.01); *H01F 38/14* (2013.01); *H02H 3/20* (2013.01); *H02J 5/005* (2013.01);
(Continued)

(58) Field of Classification Search
CPC . H02J 17/00; H02J 7/045; H02J 7/025; H04B 5/0037
(Continued)

(56) References Cited

U.S. PATENT DOCUMENTS

| 7,605,496 B2* | 10/2009 | Stevens | H02J 5/005 307/17 |
| 2010/0001845 A1* | 1/2010 | Yamashita | H02J 7/025 340/10.4 |
| 2012/0032645 A1* | 2/2012 | Matsuura | H02J 7/0031 320/134 |

FOREIGN PATENT DOCUMENTS

| JP | 2001-102974 A | 4/2001 |
| JP | 2002-034169 A | 1/2002 |

(Continued)

OTHER PUBLICATIONS

U.S. Appl. No. 14/345,527, filed Mar. 18, 2014, Haseno, et al.
International Search Report dated Dec. 25, 2012 in PCT/JP2012/076405.

*Primary Examiner* — Rexford Barnie
*Assistant Examiner* — Toan Vu
(74) *Attorney, Agent, or Firm* — Chip Law Group

(57) ABSTRACT

A feed unit includes: a power transmission section configured to perform power transmission with use of a magnetic field or an electronic field; a power limiting section provided on a power supply line from an external power source to the power transmission section; and a control section provided on a side closer to the external power source than the power limiting section, and including a power transmission control section, the power transmission control section being configured to control the power transmission.

21 Claims, 9 Drawing Sheets

(51) Int. Cl.

| | | |
|---|---|---|
| *H01F 27/42* | (2006.01) | |
| *H04B 5/00* | (2006.01) | |
| *H02J 5/00* | (2016.01) | |
| *H02J 7/02* | (2016.01) | |
| *H02M 7/537* | (2006.01) | |
| *H01F 38/14* | (2006.01) | |
| *H02H 3/20* | (2006.01) | |
| *H03C 1/00* | (2006.01) | |
| *H03K 7/08* | (2006.01) | |
| *H03L 5/02* | (2006.01) | |
| *H04L 5/22* | (2006.01) | |
| *H02J 7/00* | (2006.01) | |
| *H02M 7/48* | (2007.01) | |

(52) U.S. Cl.
CPC .......... *H02J 7/025* (2013.01); *H02M 7/537* (2013.01); *H03C 1/00* (2013.01); *H03K 7/08* (2013.01); *H03L 5/02* (2013.01); *H04L 5/22* (2013.01); *H01F 2038/143* (2013.01); *H02J 7/0044* (2013.01); *H02M 2007/4815* (2013.01); *Y02B 70/1441* (2013.01)

(58) Field of Classification Search
USPC ........................................................ 307/104
See application file for complete search history.

(56) References Cited

FOREIGN PATENT DOCUMENTS

| | | |
|---|---|---|
| JP | 2005-073350 A | 3/2005 |
| JP | 2005-110399 A | 4/2005 |
| JP | 2008-206233 A | 9/2008 |
| JP | 2008-312434 A | 12/2008 |
| JP | 2010-016985 A | 1/2010 |
| JP | 2010-063245 A | 3/2010 |
| JP | 2011-035964 A | 2/2011 |

\* cited by examiner

[ FIG. 1 ]
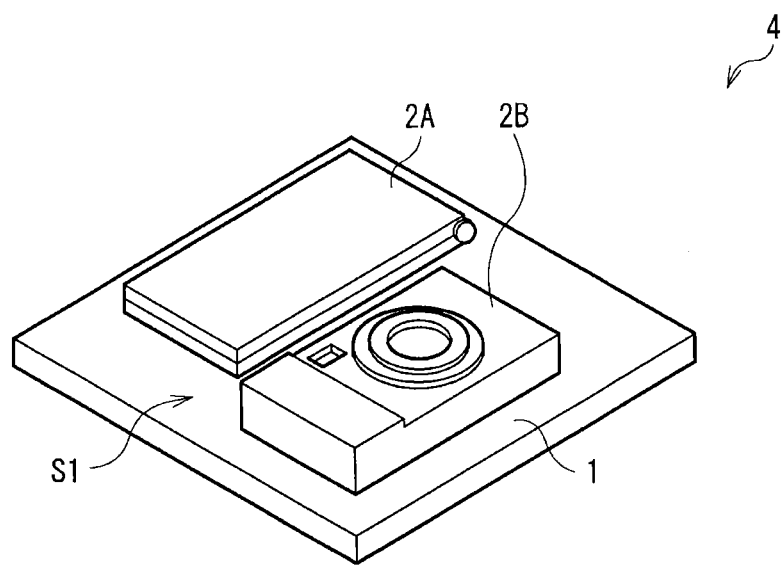

[ FIG. 2 ]
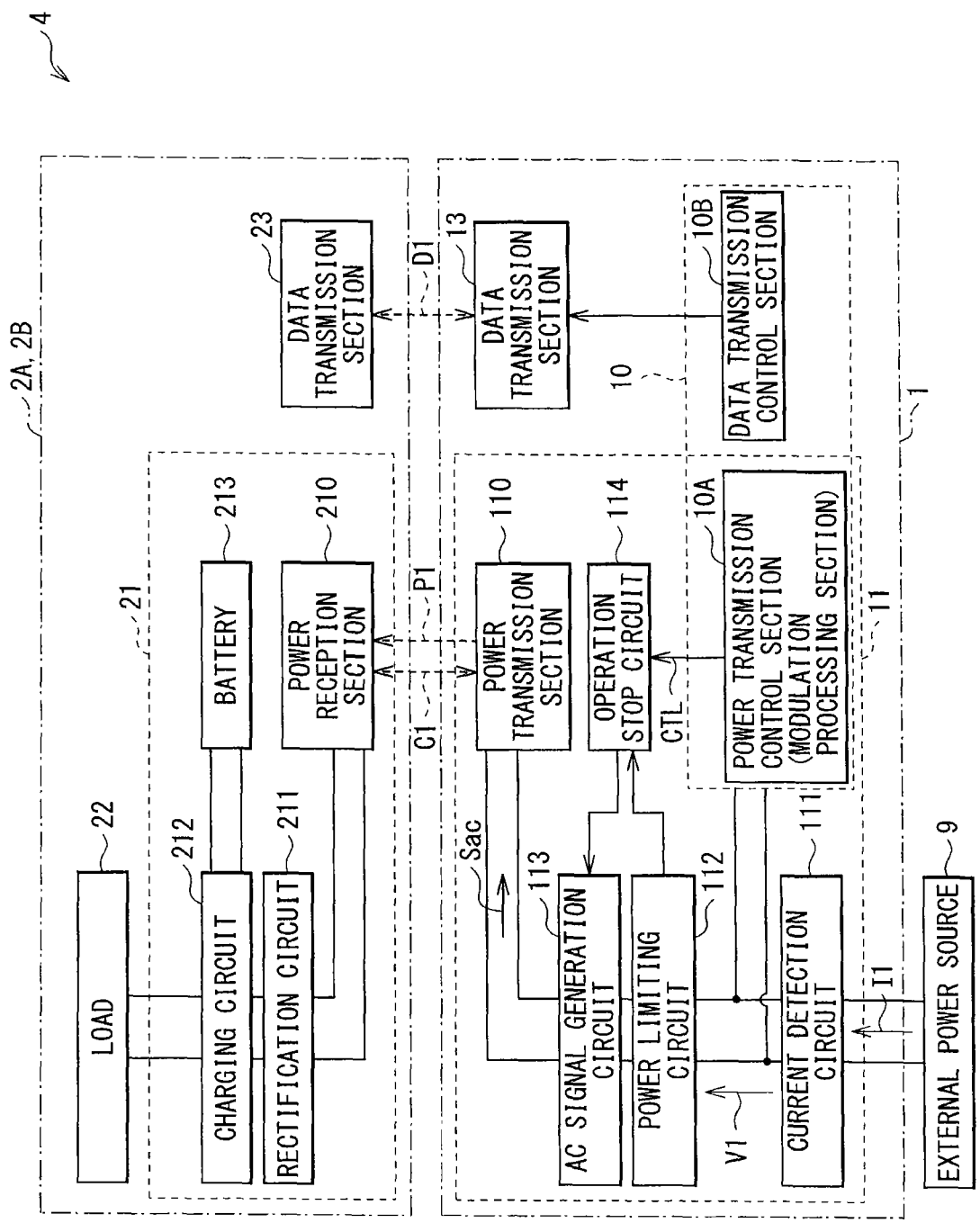

[FIG. 3]
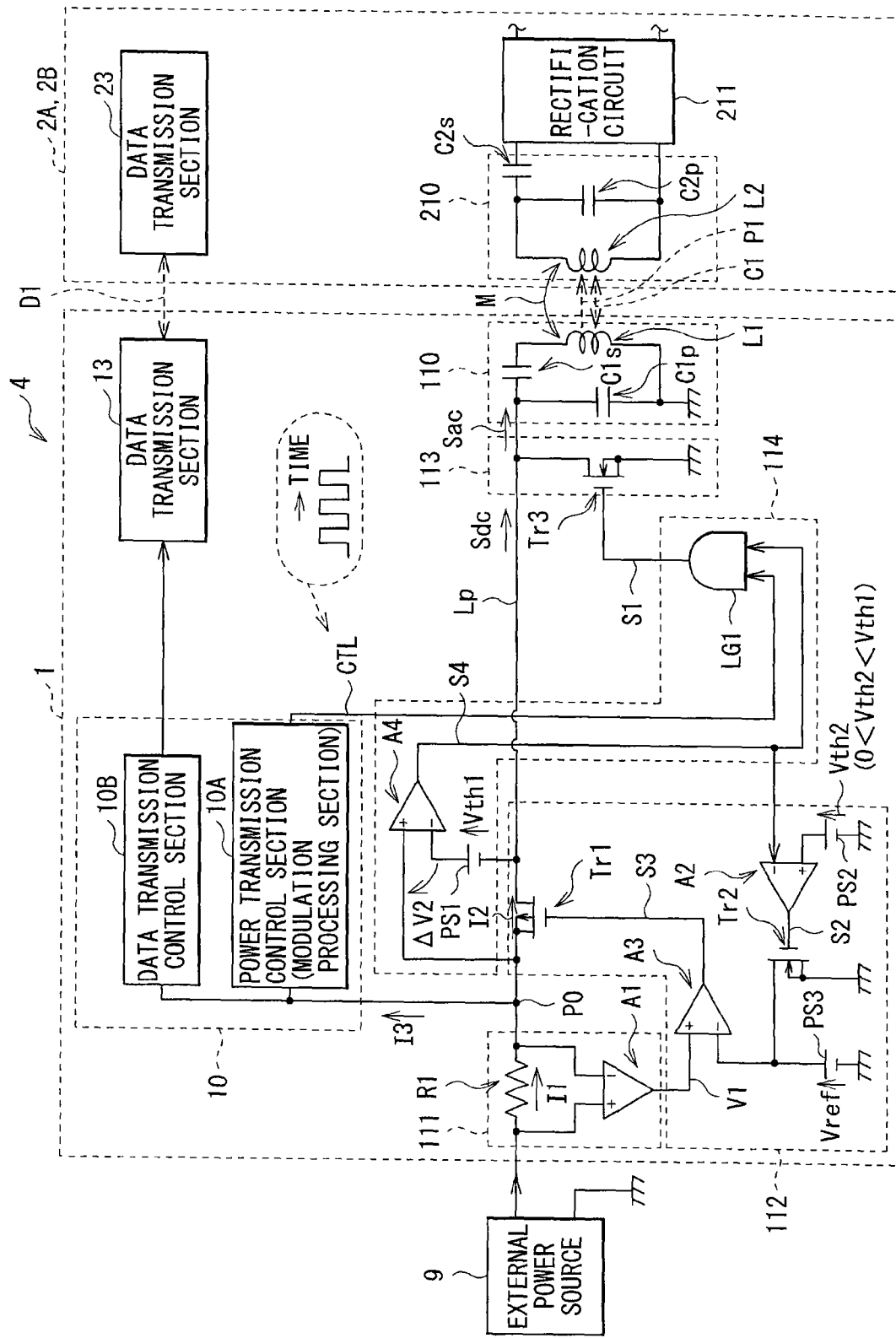

[ FIG. 4 ]
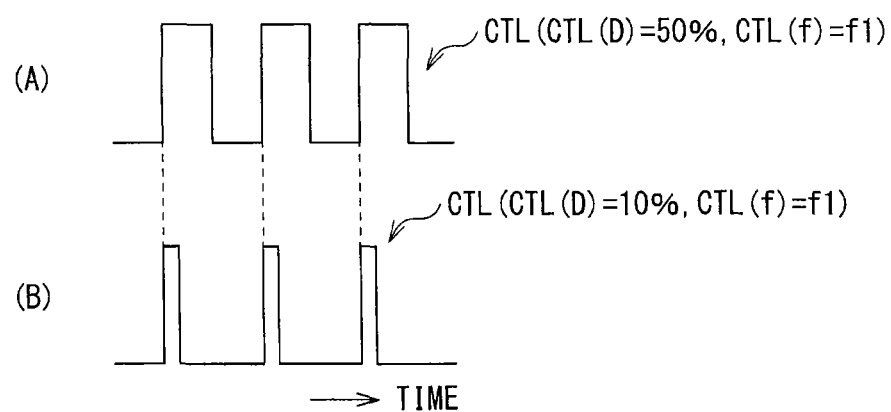
[ FIG. 5 ]
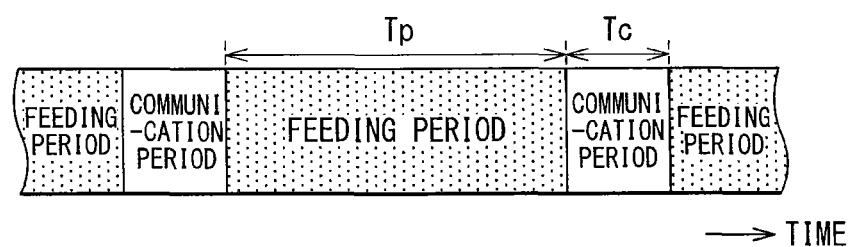

[ FIG. 6 ]
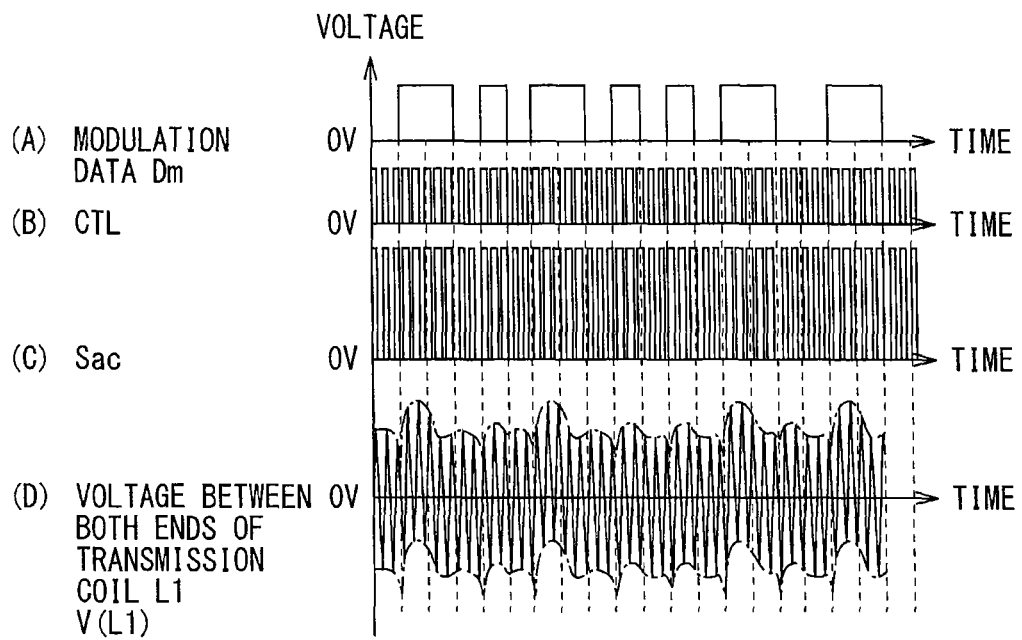
[ FIG. 7 ]
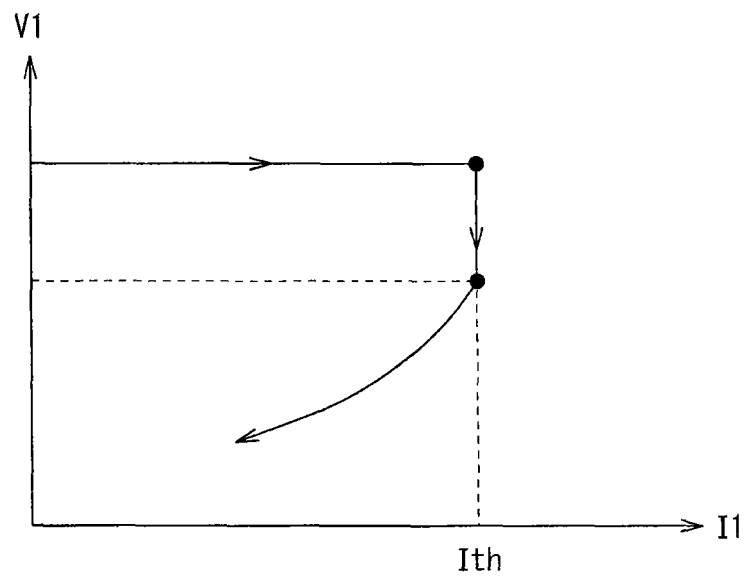

[ FIG. 8 ]
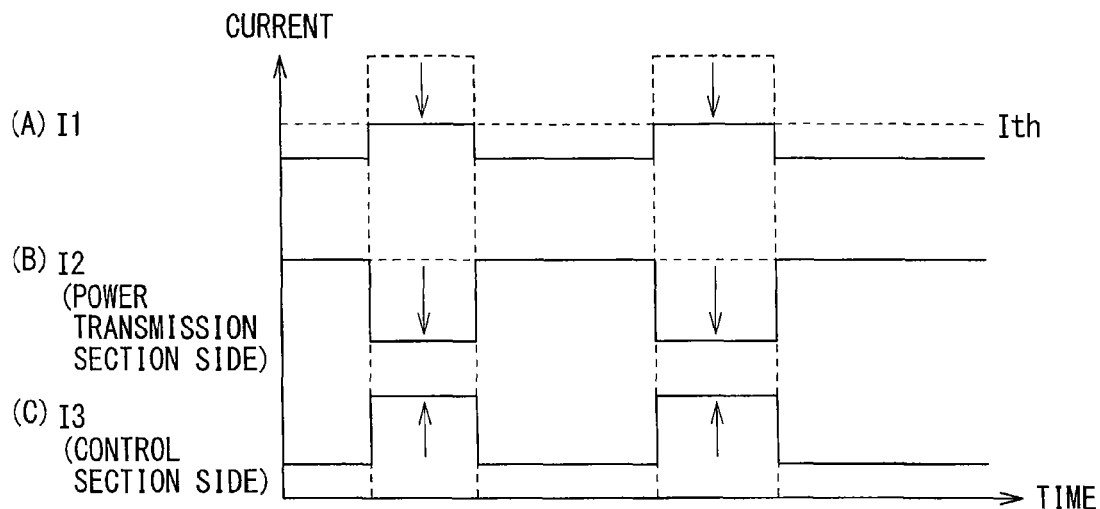
[ FIG. 9 ]
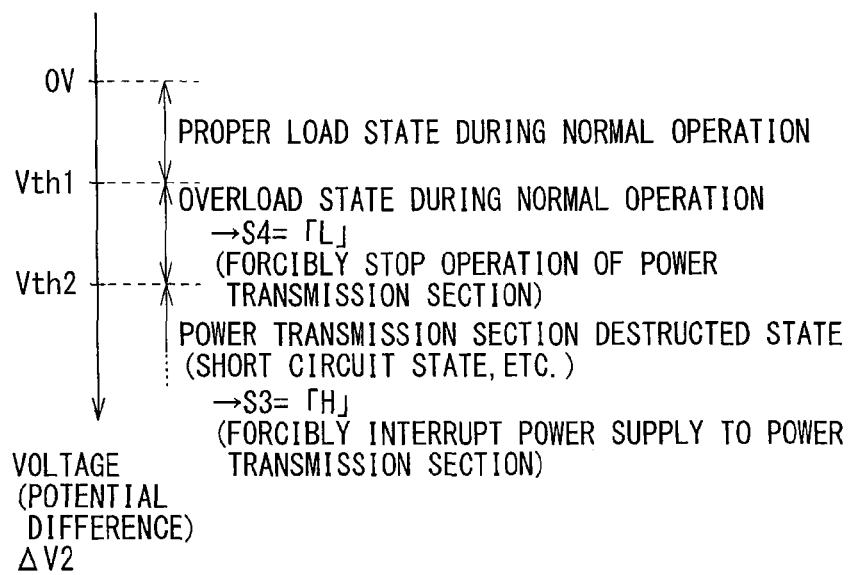

[ FIG. 10 ]
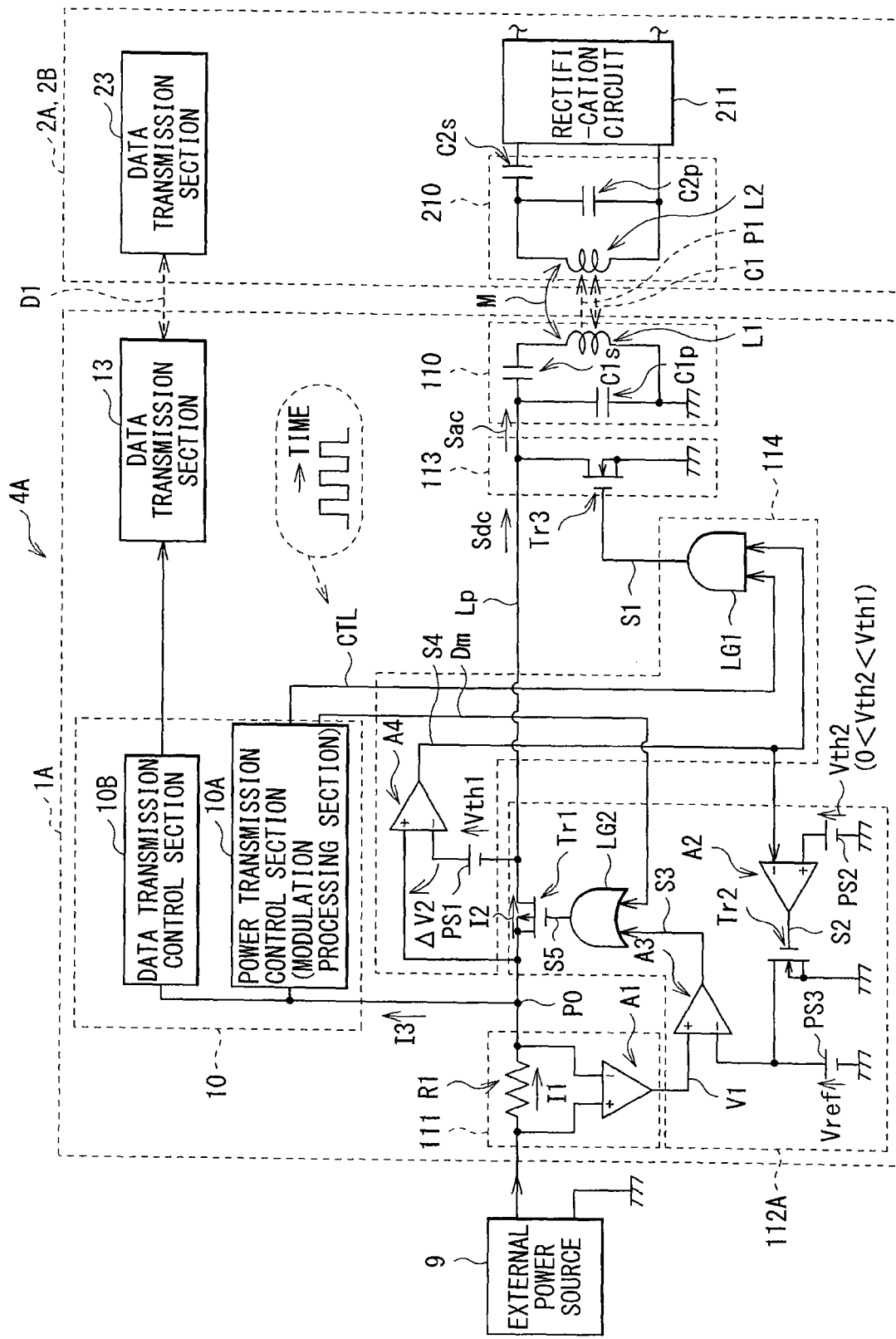

[ FIG. 11 ]
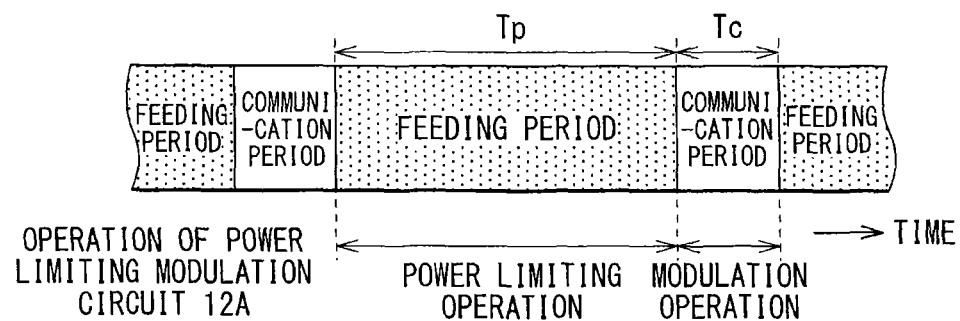
[ FIG. 12 ]
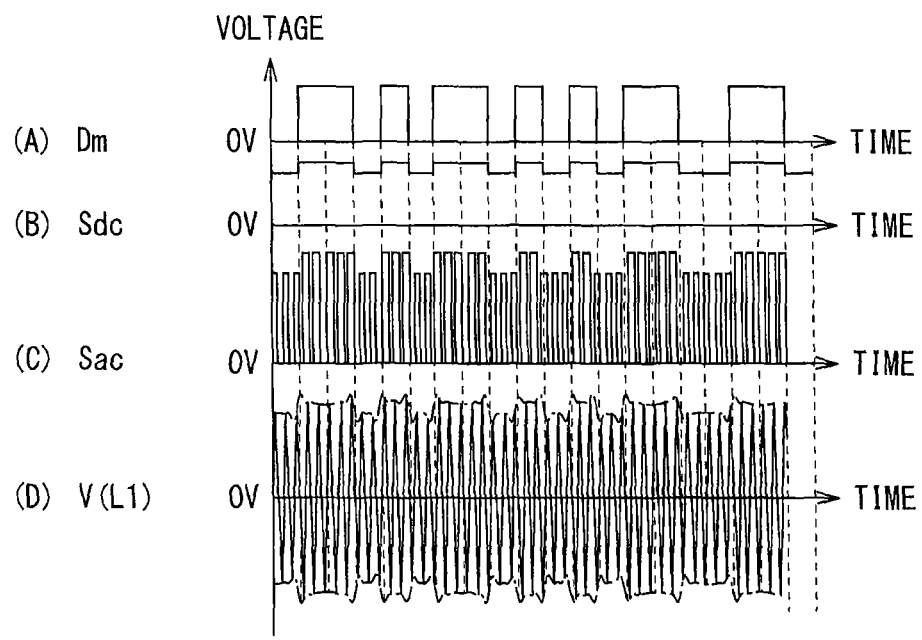

[ FIG. 13 ]
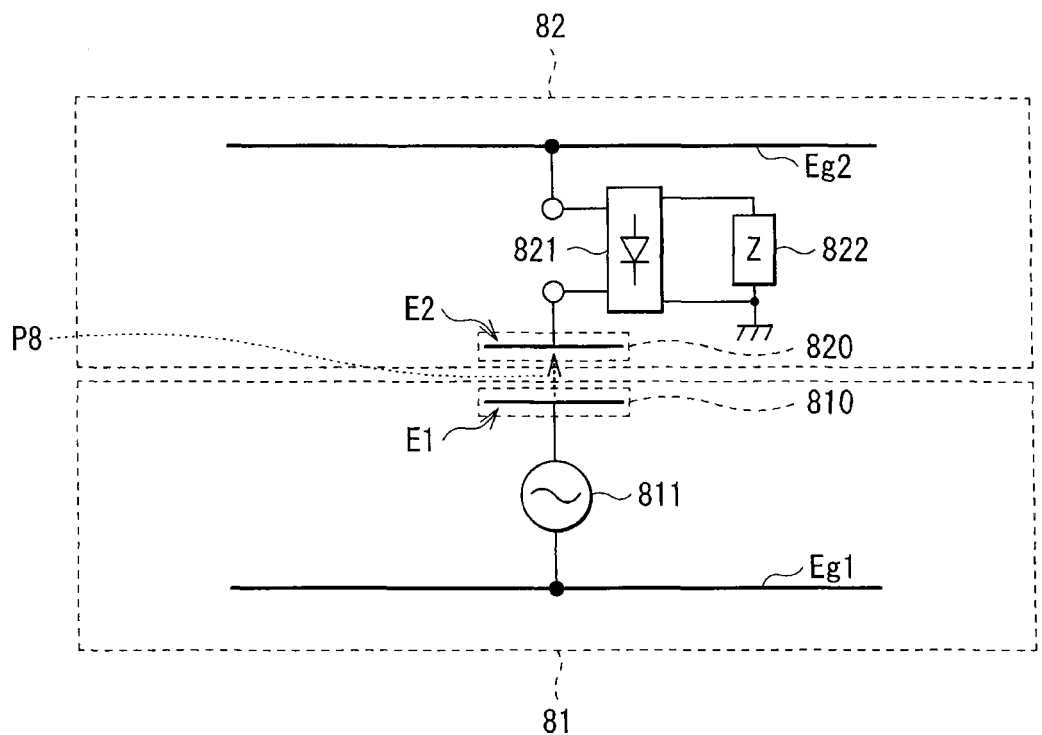
[ FIG. 14 ]
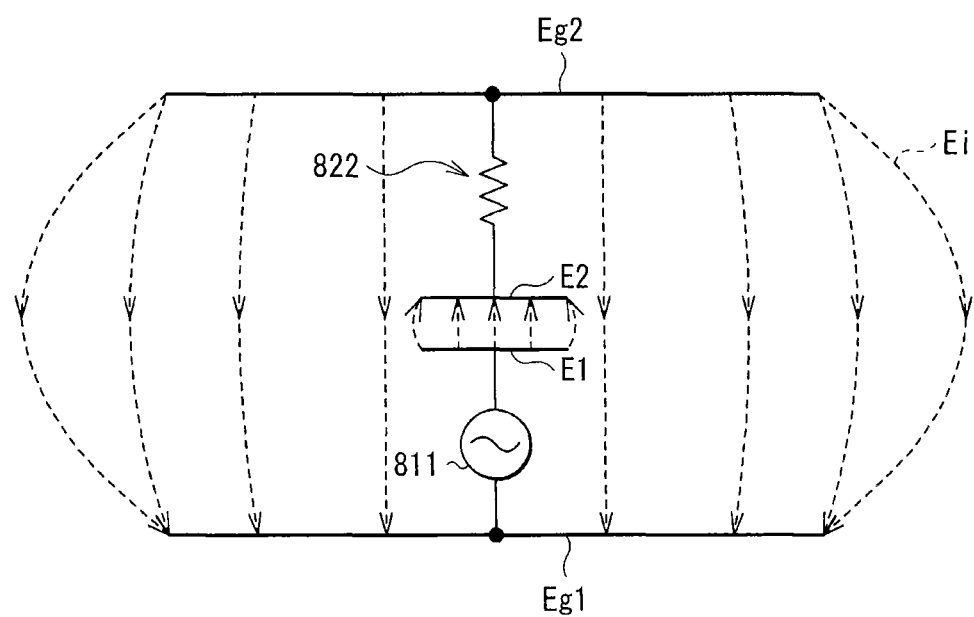

FEED UNIT AND FEED SYSTEM FOR NON-CONTACT POWER TRANSMISSION

TECHNICAL FIELD

The present disclosure relates to a feed system performing non-contact power supply (power transmission) on a unit to be fed with power such as an electronic apparatus, and to a feed unit applied to such a feed system.

BACKGROUND ART

In recent years, a feed system (a non-contact feed system, or a wireless charging system) performing non-contact power supply (power transmission) on consumer electronics devices (CE devices) such as mobile phones and portable music players has attracted attention. Accordingly, charging is allowed to be started by not inserting (connecting) a connector of a power supply such as an AC adapter into a unit but placing an electronic apparatus (a secondary-side unit) on a charging tray (a primary-side unit). In other words, terminal connection between the electronic apparatus and the charging tray is unnecessary.

As a method of performing non-contact power supply in such a way, an electromagnetic induction method is well known. In addition, a non-contact feed system using a method called magnetic resonance method which uses electromagnetic resonance phenomenon has attracted attention. Such a non-contact feed system has been disclosed in, for example, PTLs 1 to 6.

CITATION LIST

Patent Literature

PTL 1: Japanese Unexamined Patent Application Publication No.
PTL 2: International Publication No. WO00-27531
PTL 3: Japanese Unexamined Patent Application Publication No. 2008-206233
PTL 4: Japanese Unexamined Patent Application Publication No. 2002-34169
PTL 5: Japanese Unexamined Patent Application Publication No. 2005-110399
PTL 6: Japanese Unexamined Patent Application Publication No. 2010-63245

SUMMARY OF INVENTION

Incidentally, in the non-contact feed system described above, the load state of the feed unit is changed depending on situations, and for example, may be changed to overload state in some cases. Therefore, even in the case where such load change occurs, securement of proper control in the feed unit is demanded. Therefore, proportion of a method that is capable of achieving proper control irrespective of the load state in power transmission (non-contact power feeding) using a magnetic field or the like, is desired.

It is desirable to provide a feed unit and a feed system that are capable of achieving proper control irrespective of the load state in power transmission using a magnetic field or an electric field.

According to an embodiment of the present disclosure, there is provided a feed unit including: a power transmission section configured to perform power transmission with use of a magnetic field or an electric field; a power limiting section provided on a power supply line from an external power source to the power transmission section; and a control section provided on a side closer to the external power source than the power limiting section, and including a power transmission control section that is configured to control the power transmission.

According to an embodiment of the present disclosure, there is provided a feed system provided with one or a plurality of electronic apparatuses (units to be fed with power) and a feed unit that is configured to perform power transmission on the electronic apparatuses. The feed unit includes: a power transmission section configured to perform the power transmission with use of a magnetic field or an electronic field; a power limiting section provided on a power supply line from an external power source to the power transmission section; and a control section provided on a side closer to the external power source than the power limiting section, and including a power control section that is configured to control the power transmission.

In the feed unit and the feed system according to the respective embodiments of the present disclosure, the control section is provided on a side closer to the external power source than the power limiting section. Therefore, for example, even in the case of the overload state or the like, the power supply from the external power source to the control section side is not limited. Specifically, the power supply to the control section side is constantly ensured, and preferential power distribution to the control section side is performed.

In the feed unit and the feed system according to the respective embodiments of the present disclosure, the control section is provide on a side closer to the external power source than the power limiting section. Therefore, the power supply from the external power source to the control section side is constantly ensured, and preferential power distribution to the control section side is performed. Consequently, stable operation of the control section is ensured, and proper control is achieved irrespective of the load state in the power transmission using a magnetic field or an electronic field.

BRIEF DESCRIPTION OF DRAWINGS

FIG. 1 is a perspective view illustrating an appearance configuration example of a feed system according to a first embodiment of the present disclosure.

FIG. 2 is a block diagram illustrating a detailed configuration example of the feed system illustrated in FIG. 1.

FIG. 3 is a circuit diagram illustrating a detailed configuration example of each block illustrated in FIG. 2.

FIG. 4 is a timing waveform chart illustrating an example of a control signal to an AC signal generation circuit.

FIG. 5 is a timing chart illustrating an example of a feeding period and a communication period.

FIG. 6 is a timing waveform chart illustrating an example of communication operation by pulse width modulation with use of the AC signal generation circuit.

FIG. 7 is a characteristic diagram schematically illustrating an example of drooping characteristics in an overload state.

FIG. 8 is a timing waveform chart for explaining power limiting distribution function in the overload state.

FIG. 9 is a schematic diagram for explaining forcible operation stop function and forcible power supply interruption function.

FIG. 10 is a circuit diagram illustrating a configuration example of a main part in a feed system according to a second embodiment.

FIG. 11 is a timing chart illustrating an operation example of a power limiting modulation circuit illustrated in FIG. 10.

FIG. 12 is a timing waveform chart illustrating an example of communication operation by amplitude modulation with use of the power limiting modulation circuit illustrated in FIG. 10.

FIG. 13 is a block diagram illustrating a schematic configuration example of a feed system according to a modification.

FIG. 14 is a schematic diagram illustrating an example of propagation state of an electric field in the feed system illustrated in FIG. 13.

DESCRIPTION OF EMBODIMENTS

Some embodiments of the present disclosure will be described in detail below with reference to drawings. Note that description will be given in the following order.
1. First embodiment (an example of performing communication by pulse width modulation with use of an AC signal generation circuit)
2. Second embodiment (an example of also performing communication by amplitude modulation with use of a power limiting circuit)
3. Modifications (an example of a feed system performing non-contact power transmission using an electric field, etc.)

First Embodiment (General Configuration of Feed System 4)

FIG. 1 illustrates an appearance configuration example of a feed system (a feed system 4) according to a first embodiment of the present disclosure, and FIG. 2 illustrates a block configuration example of the feed system 4. The feed system 4 is a system (a non-contact feed system) performing non-contact power transmission (power supply, power feeding, or power transmission) with use of a magnetic field (with use of magnetic resonance, electromagnetic induction, and the like, hereinafter the same). The feed system 4 includes a feed unit 1 (a primary-side unit), and one or a plurality of electronic apparatuses (in this case, two electronic apparatuses 2A and 2B, secondary-side units) as units to be fed with power.

As illustrated in FIG. 1, for example, in the feed system 4, the electronic apparatuses 2A and 2B are placed (or closely disposed) on a feeding surface (a power transmission surface) S1 of the feed unit 1 so that the power transmission is performed from the feed unit 1 to the electronic apparatuses 2A and 2B. In this case, in consideration of the case where the power transmission is performed to the plurality of electronic apparatuses 2A and 2B at the same time or in a time-divisional manner (sequentially), the feed unit 1 has a mat shape (a tray shape) in which an area of the feeding surface S1 is larger than the size of the electronic apparatuses 2A and 2B, etc., to be fed with power.

(Feed Unit 1)

As described above, the feed unit 1 is a unit (a charging tray) transmitting power (performing power transmission) to the electronic apparatuses 2A and 2B with use of a magnetic field. As illustrated in FIG. 2, for example, the feed unit 1 may include a power transmission section 110, a current detection circuit 111, a power limiting circuit 112, a power transmission device 11 including an AC signal generation circuit (high-frequency power generation circuit) 113 and an operation stop circuit 114, and a data transmission section 13. Moreover, the feed unit 1 may include a control section 10 including a power transmission control section (a modu-lation processing section) 10A that is provided in the power transmission device 11 and a data transmission control section 10B that is provided outside the power transmission device 11. Among them, the power limiting circuit 112, the AC signal generation circuit 113, the operation stop circuit 114, and the data transmission control section 10B correspond to specific examples of "power limiting section", "AC signal generation section", "operation stop section", and "data transmission control section", respectively.

The power transmission section 110 is configured to include a power transmission coil (a primary-side coil) L1, capacitors C1p and C1s (resonance capacitors), and the like, that will be described later. The power transmission section 110 uses the power transmission coil L1 and the capacitors C1p and C1s to transmit power (perform power transmission) to the electronic apparatuses 2A and 2B (in detail, a power reception section 210 described later) with use of an AC magnetic field (see an arrow P1 in FIG. 2). More specifically, the power transmission section 110 has a function of radiating a magnetic field (a magnetic flux) from the feeding surface S1 toward the electronic apparatuses 2A and 2B. The power transmission section 110 further has a function of performing predetermined mutual communication operation with the power reception section 210 described later (see an arrow C1 in FIG. 2).

For example, the AC signal generation circuit 113 is a circuit that uses power supplied from an external power source 9 (a master power source) of the feed unit 1 through the power limiting circuit 112 described later to generate a predetermined AC signal Sac (high-frequency power) to transmit power. Such an AC signal generation circuit 113 may be configured using, for example, a switching amplifier described later. Note that, as the external power source 9, for example, a power source (power supply capacity: 500 mA, source voltage: about 5 V) of universal serial bus (USB) 2.0 that is provided in personal computer (PC) or the like may be used.

The power limiting circuit 112 is provided on a power supply line (a power supply line Lp described later) from the external power source 9 to the power transmission section 110, namely, between a power input terminal (not illustrated) for the external power source 9 and the power transmission section 110. The power limiting circuit 112 has a function of limiting (performing power limiting operation) power supplied from the external power source 9 to the power transmission section 110. More specifically, although the detail will be described later, the power limiting circuit 112 functions as an overcurrent limiting circuit (an overcurrent protection circuit) that limits an overcurrent in an overload state, or the like. In addition, the power limiting circuit 112 has a function of forcibly interrupting power supply from the external power source 9 to the power transmission section 110 in a predetermined case described later.

The current detection circuit 111 is a circuit detecting an input current I1 that flows from the external power source 9 to the entire feed unit 1. Specifically, the current detection circuit 111 detects (measures) a voltage corresponding to the input current I1 to output the voltage to the power limiting circuit 112.

The operation stop circuit 114 is a circuit that forcibly stops power transmission by the power transmission section 10 and the like, irrespective of the power transmission control by the power transmission control section 10A described later, when an abnormal state (an overload state or the like) of the unit described later is detected.

The data transmission section 13 performs non-contact mutual data transmission with a data transmission section 23 described later in the electronic apparatuses 2A and 2B (see an arrow D1 in FIG. 2). Incidentally, examples of a method of performing such non-contact data transmission may include a method using "Transfer Jet" that is one of short distance wireless transfer technologies.

As illustrated in FIG. 2, the control section 10 is provided in a preceding stage of the power limiting circuit 112 (on a side closer to the external power source 9 than the power limiting circuit 112), namely, between the power input terminal (not illustrated) for the external power source 9 and the power limiting circuit 112. The control section 10 is configured to include the power transmission control section 10A that controls power transmission by the power transmission section 110, and the data transmission control section 10B that controls data transfer by the data transmission section 13, and performs various control operation in the entire feed unit 1 (the entire feed system 4). More specifically, the control section 10 may include a function of performing proper control of the transmitted power, a function of authenticating a secondary-side unit, a function of determining whether a secondary-side unit is placed on a primary-side unit, a function of detecting a contaminant such as dissimilar metal, and the like, in addition to the above-described function of power transmission control and the data transmission control.

The power transmission control section 10A controls the operation of the AC signal generation circuit 113 (in this case, through the operation stop section 114) with use of a predetermined control signal CTL (a control signal for power transmission) described later, to perform the above-described power transmission control. Moreover, the power transmission control section 10A has a function of performing modulation processing by pulse width modulation (PWM) described later with use of the control signal CTL.

(Electronic Apparatuses 2A and 2B)

For example, the electronic apparatuses 2A and 2B are each configured of a stationary electronic apparatus typified by a television receiver, a portable electronic apparatus including a rechargeable battery (battery), typified by a mobile phone and a digital camera, or the like. For example, as illustrated in FIG. 2, these electronic apparatuses 2A and 2B each may include a power reception device 21, a load 22 that performs predetermined operation (operation exerting functions as an electronic apparatus) based on power supplied from the power reception device 21, and the data transmission section 23. In addition, the power reception device 21 may include the power reception section 210, a rectification circuit 211, a charging circuit 212, and a battery 213.

The power reception section 210 is configured to include a power reception coil (a secondary-side coil) L2, capacitors C2p and C2s (resonance capacitors), and the like, that will be described later. The power reception section 210 has a function of receiving power transmitted from the power transmission section 110 in the feed unit 1 with use of the power reception coil L2, the capacitors C2p and C2s, and the like. The power reception section 210 further has a function of performing the above-described predetermined mutual communication operation with the power transmission section 110 (see the arrow C1 in FIG. 2).

The rectification circuit 211 is a circuit that rectifies the power (AC power) supplied from the power reception section 210 to generate DC power.

The charging circuit 212 is a circuit that performs charging on the battery 213 or a battery (not illustrated) in the load 22, based on the DC power supplied from the rectification circuit 211.

The battery 213 stores therein power in response to the charging by the charging circuit 212, and may be configured using a rechargeable battery (a secondary battery) such as a lithium ion battery. Note that, in the case of using only the battery in the load 22, or the like, the battery 213 may be not necessarily provided.

As described above, the data transmission section 23 performs the non-contact mutual data transmission with the data transmission section 13 in the feed unit 1 (see the arrow D1 in FIG. 2).

(Detailed Configurations of Feed Unit 1 and Electronic Apparatuses 2A and 2B)

FIG. 3 is a circuit diagram illustrating a detailed configuration example of each block in the feed unit 1 and the electronic apparatuses 2A and 2B illustrated in FIG. 2.

(Power Transmission Section 110)

The power transmission section 110 includes the power transmission coil L1 to perform power transmission using a magnetic field (to generate a magnetic flux), and the capacitors C1p and C1s to form, together with the power transmission coil L1, an LC resonance circuit. The capacitor C1s is electrically connected in series to the power transmission coil L1. In other words, an end of the capacitor C1s and an end of the power transmission coil L1 are connected to each other. Moreover, the other end of the capacitor C1s and the other end of the power transmission coil L1 are connected in parallel to the capacitor C1p, and the connection end of the power transmission coil L1 and the capacitor C1p is grounded.

The LC resonance circuit configured of the power transmission coil L1 and the capacitors C1p and C1s, and an LC resonance circuit described later configured of the power reception coil L2 and the capacitors C2p and C2s are magnetically coupled with each other. As a result, LC resonance operation by a resonance frequency that is substantially the same as that of the high-frequency power (the AC signal Sac) described later generated by the AC signal generation circuit 113, is performed.

(Current Detection Circuit 111)

The current detection circuit 111 has a resistor R1 and an error amplifier A1. An end of the resistor R1 is connected to the power input terminal (not illustrated) for the external power source 9, and the other end of the resistor R1 is connected to a connection point P0. In other words, the resistor R1 is disposed on the power supply line Lp. An input terminal on a positive side (a plus side) of the error amplifier A1 is connected to the end of the resistor R1, an input terminal on a negative side (a minus side) is connected to the other end of the resistor R1, and an output terminal is connected to an input terminal on a positive side of an error amplifier A3 in the power limiting circuit 112, described later. In other words, a potential difference (a voltage) between the both ends of the resistor R1 is input to the input terminal on the positive side of the error amplifier A3.

With such a configuration, the current detection circuit 111 detects the above-described input current I1 flowing through the resistor R1 (the current flowing through the power supply line Lp), and outputs a voltage V1 corresponding to the magnitude of the input current I from the error amplifier A1 to the error amplifier A3.

(Power Limiting Circuit 112)

The power limiting circuit 112 includes transistors Tr1 and Tr2, a comparator A2, the error amplifier A3, and the power sources PS2 and PS3. Among them, the transistor Tr1 is configured of a p-type field effective transistor (FET), and the transistor Tr2 is configured of an n-type FET. Moreover, the power source PS2 is a power source outputting a predetermined threshold voltage Vth2 (>0 V) (a second threshold) described later, and the power source PS3 is a power source outputting a reference voltage Vref described later. Note that the transistor Tr1 and the error amplifier A3 correspond to specific examples of "transistor" and "error amplifier" in the present disclosure, respectively.

A source of the transistor Tr1 is connected to the connection point P0, a drain is connected to an end of each of the above-described capacitors C1p and Cs1, and a gate is connected to an output terminal of the error amplifier A3. In other words, the transistor Tr1 is disposed on the power supply line Lp. An input terminal on a negative side of the comparator A2 is connected to an output terminal of a comparator A4 described later in the operation stop circuit 114, an input terminal on a positive side is connected to the power source PS2, and an output terminal is connected to a gate of the transistor Tr2. A source of the transistor Tr2 is grounded, and a drain is connected to the power source PS3 and an input terminal on a negative side of the error amplifier A3.

With this configuration, in the power limiting circuit 112, an output signal S3 is generated according to a potential difference between the above-described output voltage from the error amplifier A1 (the voltage V1 corresponding to the input current I1) and the reference voltage Vref, and is supplied to the gate of the transistor Tr1. Then, according to the output signal S3, magnitude (magnitude of the power) of a current I2 (a current flowing through a path from the connection point P0 to the power transmission section 110 side, out of the above-described input current I1) flowing between the source and the drain of the transistor Tr1 is limited. In this way, the power supplied from the external power source 9 to the power transmission section 110 is limited (the overcurrent in the overload state or the like is limited).

In addition, in a predetermined case described later, the magnitude of the reference voltage Vref input to the error amplifier A3 described above is controlled by the operation stop circuit 114, and thus power supply from the external power source 9 to the power transmission section 110 is forcibly interrupted by the power limiting circuit 112. More specifically, according to a comparison result of the voltages in the comparator A2 described above, the magnitude of the reference voltage Vref is controlled.

(Control Section 10)

The control section 10 has the power transmission control section (the modulation processing section) 10A and the data transmission control section 10B that are described above, and an input terminal of each of the sections is connected to the connection point P0. In other words, the power transmission control section 10A and the data transmission control section 10B are disposed so as to be connected in parallel to each other in the preceding stage of the power limiting circuit 112 (between the external power source 9 and the power limiting circuit 112). Therefore, although the detail will be described later, a current I3 of the above-described input current I1 constantly flows through the path from the connection point P0 to the control section 10 side (irrespective of the load state).

(Operation Stop Circuit 114)

The operation stop circuit 114 has the comparator A4, a power source PS1 outputting a predetermined threshold voltage Vth1 (>Vth2) (first threshold) described later, and an AND circuit LG1. Among them, the comparator A4 and the AND circuit LG1 correspond to specific examples of "voltage detection section" and "switching section" in the present disclosure, respectively.

An input terminal on a positive side of the comparator A4 is connected to the source of the transistor Tr1, and an input terminal on a negative side is connected to the drain of the transistor Tr1 through the power source PS1. An output terminal of the comparator A4 is connected to the input terminal on the negative side of the comparator A2 described above and one of input terminals of the AND circuit LG1. In addition, the other input terminal of the AND circuit LG1 is supplied with the control signal CTL for power transmission from the power transmission control section 10A.

As illustrated in FIG. 3, the control signal CTL is formed of a pulse signal having a predetermined duty ratio. In addition, for example, as illustrated in (A) and (B) of FIG. 4, controlling the duty ratio of the control signal CTL causes pulse width modulation described later.

With such a configuration, in the operation stop circuit 114, a voltage $\Delta V2$ between the input and the output of the power limiting circuit 112 (the potential difference between the source and the drain of the transistor Tr1) is detected by the comparator A4, and is compared with the above-described threshold voltage Vth1. Then, an abnormal state (such as an overload state) described later of the unit is detected according to the comparison result of the voltages (the magnitude of the detected voltage $\Delta V2$), and the power transmission operation by the AC signal generation circuit 113 and the power transmission section 110 is forcibly stopped through the AND circuit LG1, according to the detection result.

(AC Signal Generation Circuit 113)

The AC signal generation circuit 113 is configured using a switching amplifier (a so-called class-E amplifier) that has one transistor Tr3 as a switching device. Moreover, in this example, the transistor Tr3 is configured of an n-type FET. A source of the transistor Tr3 is grounded, a gate is connected to the output terminal of the AND circuit LG1 described above, and a drain is connected to the drain of the transistor Tr1 and the end of each of the capacitors C1p and C1s that are described above.

With such a configuration, in the AC signal generation circuit 113, the transistor Tr3 performs ON-OFF operation (switching operation by a predetermined frequency and the duty ratio), according to the output signal (a signal S1) from the AND circuit LG1 based on the above-described control signal CTL for the power transmission. Specifically, the ON-OFF operation of the transistor Tr3 as the switching device is controlled with use of the control signal CTL supplied from the power transmission control section 10A. Accordingly, the AC signal Sac (AC power) is generated based on a DC signal Sdc that is input through the power limiting circuit 112, and the AC signal Sac is supplied to the power transmission section 110.

(Power Reception Section 210)

The power reception section 210 includes a power reception coil L2 to receive the power (from the magnetic flux) transmitted from the power transmission section 110 and the capacitors C2p and C2s to form, together with the power reception coil L2, an LC resonance circuit. The capacitor C2p is electrically connected in parallel to the power reception coil L2, and the capacitor C2s is electrically connected in series to the power reception coil L2. In other words, an end of the capacitor C2s is connected to an end of the capacitor C2p and an end of the power reception coil L2. In addition, the other end of the capacitor C2s is connected to one of the input terminals of the rectification circuit 211, and the other end of the power reception coil L2 and the other end of the capacitor C2p are connected to the other input terminal of the rectification circuit 211.

The LC resonance circuit configured of the power reception coil L2 and the capacitors C2p and Cs2 and the above-described LC resonance circuit configured of the power transmission coil L1 and the capacitors C1p and C1s are magnetically coupled with each other. As a result, LC resonance operation by a resonance frequency that is substantially the same as that of the high-frequency power (the AC signal Sac) generated by the AC signal generation circuit 113, is performed.

(Function and Effects of Feed System 4)

(1. Outline of General Operation)

In the feed system 4, the AC signal generation circuit 113 in the feed unit 1 supplies predetermined high-frequency power (the AC signal Sac) for power transmission, to the power transmission coil L1 and the capacitors C1p and C1s (the LC resonance circuit) in the power transmission section 110, based on the power supplied from the external power source 9. Accordingly, a magnetic field (a magnetic flux) is generated in the power transmission coil L1 in the power transmission section 110. At this time, when the electronic apparatuses 2A and 2B that are units to be fed with power (to be charged) are placed (or closely disposed) on a top surface (the feeding surface S1) of the feed unit 1, the power transmission coil L1 in the feed unit 1 and the power reception coil L2 in each of the electronic apparatuses 2A and 2B are brought close to each other near the feeding surface S1.

In this way, when the power reception coil L2 is disposed near the power transmission coil L1 generating the magnetic field (the magnetic flux), electromotive force is generated in the power reception coil L2 by induction of the magnetic flux generated from the power transmission coil L1. In other words, interlinkage magnetic field is generated in each of the power transmission coil L1 and the power reception coil L2 by electromagnetic induction or magnetic resonance. As a result, power is transmitted from the power transmission coil L1 side (a primary side, the feed unit 1 side, the power transmission section 110 side) to the power reception coil L2 side (a secondary side, the electronic apparatuses 2A and 2B side, the power reception section 210 side) (see the arrow P1 in FIG. 2 and FIG. 3). At this time, the power transmission coil L1 on the feed unit 1 side and the power reception coil L2 on the electronic apparatuses 2A and 2B side are magnetically coupled with each other by the electromagnetic induction or the like, and thus the LC resonance operation is performed in the above-described LC resonance circuit.

Then, in the electronic apparatuses 2A and 2B, the AC power received by the power reception coil L2 is supplied to the rectification circuit 211 and the charging circuit 212, thereby leading to the following charging operation. Specifically, after the AC power is converted into predetermined DC power by the rectification circuit 211, charging to the battery 213 or the battery (not illustrated) in the load 22 based on the DC power is performed by the charging circuit 212. In this way, in the electronic apparatuses 2A and 2B, the charging operation based on the power received by the power reception section 210 is performed.

In other words, in the present embodiment, terminal connection to an AC adopter or the like is not necessary for charging of the electronic apparatuses 2A and 2B, and charging is easily started (non-contact feeding is performed) only by placing (closely disposing) the electronic apparatuses 2A and 2B on the feeding surface S1 of the feed unit 1. This leads to liability relief of a user.

In addition, for example, as illustrated in FIG. 5, in such feeding operation, a feeding period Tp (a charging period) and a communication period Tc (a non-charging period) are periodically (or non-periodically) performed in a time-divisional manner. In other words, the power transmission control section 10A performs control so that the feeding period Tp and the communication period Tc are periodically (or non-periodically) set in a time-divisional manner. In this case, the communication period Tc is a period during which mutual communication operation (communication operation for mutual authentication between units, feed efficiency control, or the like) is performed between the primary-side unit (the feed unit 1) and the secondary-side unit (the electronic apparatuses 2A and 2B) with use of the power transmission coil L1 and the power reception coil L2 (see the arrow C1 in FIG. 2 and FIG. 3). Incidentally, the time ratio of the feeding period Tp and the communication period Tc at this time may be, for example, the feeding period Tp: the communication period Tc=about 9:1.

At this time, for example, as illustrated in (A) to (D) of FIG. 6, during the communication period Tc, the communication operation using pulse width modulation is performed by the AC signal generation circuit 113. Specifically, the duty ratio of the control signal CTL during the communication period TC is set (see (B) of FIG. 6), for example, based on modulation data Dm illustrated in (A) of FIG. 6, and thus the communication by the pulse width modulation is performed. Note that, since it is difficult to perform frequency modulation at the time of resonance operation by the power transmission section 110 and the power reception section 210 described above, such pulse width modulation is used to achieve the communication operation easily.

Further, in the feed system 4, as illustrated by the arrow D1 in FIG. 2 and FIG. 3, non-contact mutual data transmission is performed between the data transmission section 13 in the primary-side unit (the feed unit 1) and the data transmission section 23 in the secondary-side unit (the electronic apparatuses 2A and 2B). Accordingly, the data transmission is allowed to be performed only by bring the electronic apparatuses 2A and 2B close to the feed unit 1 without connection of wirings for the data transmission or the like between the feed unit 1 and the electronic apparatuses 2A and 2B. Thus, this also leads to liability relief of a user.

(2. Power Limiting Distribution Function in Overload State)

Incidentally, in such a feed system 4, load may become excessive (overload state) in some cases in the feed unit 1. Specifically, for example, a case where the data transmission section 13 consumes excessive power suddenly, a case where the secondary-side unit (in this case, the electronic apparatuses 2A and 2B) demands excessive power, or the like are assumed.

In such an overload state, for example, as illustrated in FIG. 7, control is performed so that drooping characteristics (fold back characteristics) are exhibited in current-voltage characteristics, and protection against the overcurrent is performed. Specifically, in this case, first, the voltage V1 corresponding to the input current I1 from the external power source 9 is detected by the current detection circuit 111 in the feed unit 1. Then, in the power limiting circuit 112, the signal S3 according to the potential difference between the voltage V1 and the reference voltage Vref is output from the error amplifier A3, and the magnitude of the current I2 flowing between the source and the drain of the transistor Tr1 is controlled based on the signal S3. In other words, the magnitude of the current I2 is limited (the power supplied to the drain side of the transistor Tr1 is limited) according to the magnitude of the input current I1, which causes power limiting operation by the power limiting circuit 112. For example, in the case where the external power source 9 is the above-described power source of USB 2.0, when I1≥500 mA is established (when the power exceeds 2.5 W), it is determined as overcurrent state (the overload state).

However, if such power limiting operation is applied to the entire feed unit 1 (if power supply is limited with respect to the entire block in the feed unit 1), the following disadvantage may occur. Specifically, when the above-described overcurrent state (overload state) is established, if the power supplied to the control section 10 (in particular, the power transmission control section 10A) that performs control of the entire feed unit 1 (the entire feed system 4) is also limited, the operation of the control section 10 is stopped, which causes inconvenience. In other words, for example, since the power transmission control section 10A plays an important role of securing safety and the like in the feed system 4, even in the overload state or the like, the power transmission control section 10A is expected to perform normal operation (it is necessary for the power transmission control section 10A to secure stable operation constantly).

Accordingly, in the feed unit 1 in the present embodiment, as illustrated in FIG. 2 and FIG. 3, the control section 10 is provided in the preceding stage of the power limiting circuit 112 (between the external power source 9 and the power limiting circuit 112). Thus, the current I3 of the input current I1 that flows from the external power source 9 to the feed unit 1 constantly flows through the path from the connection point P0 to the control section 10 side (irrespective of the load state) (see FIG. 3). In other words, for example, even in the case of the overload state or the like, the power supplied from the external power source 9 to the control section 10 side is not limited. In this way, the power supplied to the control section 10 side is constantly ensured in the feed unit 1, and preferential power distribution to the control section 10 side is performed.

Specifically, for example, as illustrated by arrows in (C) of FIG. 8, even when the current I3 consumed by the control section 10 is drastically increased (even when the overload state is established), the current I3 flowing to the control section 10 side (power supply to the control section 10 side) is not limited. On the other hand, for example as illustrated by arrows in (B) of FIG. 8, when such an overload state is established, the current I2 supplied to the power transmission section 110 side that is located in the subsequent stage of the power limiting circuit 112 (the power supply to the power transmission section 110) is limited by the power limiting circuit 112. In this way, the power is distributed preferentially to the control section 10 side rather than the power transmission section 110 side.

In addition, at this time, for example, as illustrated by arrows in (A) of FIG. 8, the input current I1 flowing from the external power source 9 to the entire feed unit 1 (the power extracted from the external power source 9) is controlled to be equal to or lower than a predetermined threshold Ith (for example, in the case of the above-described power source of USB 2.0, 500 mA). As a result, supply of excessive power (exceeding supply capacity) (the input current I1 equal to or larger than the threshold Ith) from the external power source 9 is avoided. Therefore, for example, in the case where the power source of USB 2.0 provided in a PC is used as the external power source 9, "Warning" or the like is prevented from being displayed on a display screen of the PC when power exceeding supply capacity of the external power source 9 is intended to be extracted by the feed unit 1.

(3. Forcible Operation Stop Function)

Moreover, in the feed unit 1 in the present embodiment, in the operation stop circuit 114, the following forcible operation stop function is performed.

Specifically, first, in the comparator A4, the voltage ΔV2 between the input and the output of the power limiting circuit 112 (the potential difference between the source and the drain of the transistor Tr1) is detected, and magnitude comparison between the voltage ΔV2 and the predetermined threshold voltage Vth1 is performed. For example, as illustrated in FIG. 9, the threshold voltage Vth1 is a threshold defining whether the state is the overload state (the overcurrent state) during the normal operation in the feed unit 1. In other words, according to the above-described comparison result of the voltages (the magnitude of the detected voltage ΔV2), whether the state is a proper load state or the overload state during the normal operation is detected. In this case, when the magnitude of the voltage ΔV2 is equal to or lower than the threshold Vth1, it is detected that the state is the proper load state during the normal operation, and when the magnitude of the voltage ΔV2 exceeds the threshold Vth1, it is detected that the state is the overload state during the normal operation. Incidentally, detection sensitivity at this time is set by a time constant of a wiring between the comparator A4 and the AND circuit LG1, so as to be slightly dulled.

Then, in the operation stop circuit 114, according to the above-described detection result of the load state, the power transmission operation by the AC signal generation circuit 113 and the power transmission section 110 is forcibly stopped with use of the AND circuit LG1, irrespective of the power transmission control by the power transmission control section 10A. More specifically, when it is detected that the state is the proper load state during the normal operation (ΔV2≤Vth1), the output signal S4 from the comparator A4 becomes "H (high)" state. As a result, the output signal S1 from the AND circuit LG1 to the transistor Tr3 in the AC signal generation circuit 113 becomes equal to the control signal CTL for the power transmission supplied from the power transmission control section 10A (control is performed so that the control signal CTL becomes valid). Therefore, the transistor Tr3 performs ON-OFF operation with use of the control signal CTL, and thus the normal power transmission operation is performed by the AC signal generation circuit 113 and the power transmission section 110.

On the other hand, when it is detected that the state is the overload state during the normal operation (ΔV2>Vth1), the output signal S4 from the comparator A4 becomes "L (low)" state. As a result, the output signal S1 from the AND circuit LG1 to the transistor Tr3 in the AC signal generation circuit 113 is constantly in the "L" state (control is performed so that the control signal CTL becomes invalid), and the transistor Tr3 is constantly in the OFF state (the transistor Tr3 is in the open state). In other words, the AND circuit LG1 plays a role of switching the state of the control signal CTL between valid and invalid, according to the value of the output signal S4 from the comparator A4 (presence or absence of detection of the overload state). Further, in the operation stop circuit 114, rendering the control signal CTL for the power transmission invalid forcibly stops the power transmission operation by the AC signal generation circuit 113 and the power transmission section 110, irrespective of the power transmission control by the power transmission control section 10A.

In addition, in the operation stop circuit 114, when the above-described overload state (the overcurrent state) is detected also during the above-described communication period Tc in addition to such a feeding period Tp, the control signal CTL is rendered invalid similarly to forcibly stop the communication operation.

Note that, when the comparator A4 detects recovery from the overload state to the proper load state, the control signal CTL becomes valid again by the above-described principle. Therefore, also in this case, the power transmission operation is automatically restarted irrespective of the power transmission control by the power transmission control section 10A.

In such a way, when the abnormal state (the overload state) of the feed unit 1 is detected, the power transmission by the power transmission section 110 is forcibly stopped irrespective of the power transmission control by the power transmission control section 10A. Therefore, for example, when the load state is changed to the overload state or the like, the power transmission is rapidly stopped without waiting the power transmission control by the power transmission control section 10A, which reduces a time necessary for stopping the power transmission (namely, unnecessary power transmission period).

(4. Forcible Power Supply Interruption Function)

Moreover, the comparator A4 detects that the magnitude of the voltage $\Delta V2$ also exceeds the predetermined threshold Vth2 (>Vth1), forcible power supply interruption function described below is performed in the current limiting circuit 112, irrespective of the power transmission control by the power transmission control section 10A.

In this case, for example, as illustrated in FIG. 9, the threshold voltage Vth2 is a threshold that defines whether the power transmission section 110 is in a failed state or a destructed state (destructive state) due to a short circuit state or the like in the feed unit 1. In such a state, the voltage $\Delta V2$ between the both ends of the transistor Tr1 in the current limiting circuit 112 may become excessive to generate heat, and the operation stop circuit 114 may become in an inoperable state (the above-described forcible operation stop function may not be exerted).

As described above, the comparator A4 also detects whether the power transmission section 110 is in the failed state or the destructive state described above according to the detected magnitude of the voltage $\Delta V2$. Specifically, in this example, when the magnitude of the voltage $\Delta V2$ is equal to or lower than the threshold Vth2, it is detected that the power transmission section 110 is neither in the failed state nor in the destructive state. On the other hand, when the magnitude of the voltage $\Delta V2$ exceeds the threshold Vth2, it is detected that the power transmission section 110 is in the failed state or in the destructive state.

Further, when it is detected that the magnitude of the voltage $\Delta V2$ also exceeds the threshold Vth2 (in the failed state or in the destructive state), the power supply from the external power source 9 to the AC signal generation circuit 113 and the power transmission section 110 side is forcibly interrupted in the current limiting circuit 112 in the following way. In other words, the magnitude of the reference voltage Vref input to the error amplifier A3 is controlled according to the comparison result of the voltages by the comparator A2, the transistor Tr1 is constantly in the OFF state, and thus forcibly power supply interruption is performed.

More specifically, at this time ($\Delta V2>Vth2$), the output signal S2 from the comparator A2 becomes "L" state, and thus the transistor Tr2 is put into OFF state. Therefore, the potential of the input terminal on the negative side of the error amplifier A3 is drawn from the original reference voltage Vref supplied from the power source PS3 to the ground (0 V) side, and is lowered. As a result, the output signal S3 from the error amplifier A3 becomes "H" state, and the transistor Tr1 is constantly in OFF state. In this way, when the transistor Tr1 is put into OFF state, the current I2 does not flow between the source and the drain (I2=0 A), and the power supply to the power transmission section 10 side is forcibly interrupted. Further, even when the stop function of the current I2 by such a positive feedback (overcurrent suppressing function) is acted and the operation stop circuit 114 becomes an inoperable state, the power limiting circuit 112 operates until the overcurrent completely stops and thus possibility of heat generation in the transistor Tr1 described above is avoided. In other words, even when the power transmission section 110 is in the failed state or in the destructive state (even when the operation stop circuit 114 is in the inoperable state or the like), possibility of the heat generation in the feed unit 1 is avoided.

As described above, in the present embodiment, the control section 10 is provided on a side closer to the external power source 9 than the power limiting circuit 112. Therefore, the power supply from the external power source 9 to the control section 10 side is constantly ensured, which allows preferential power distribution to the control section 10 side. Therefore, the stable operation of the control section 10 is ensured, and proper control is allowed to be achieved irrespective of the load state when the power transmission is performed with use of a magnetic field. In addition, clarifying the responsibilities of the power source protection and the power distribution in the feed system 4 (the non-contact feed system) provides an effect of securing safety.

Moreover, when the abnormal state (the overload state) of the feed unit 1 is detected, the operation stop circuit 114 forcibly stops the power transmission irrespective of the power transmission control by the power transmission control section 10A. Therefore, for example, when the load state is changed to the overload state or the like, unnecessary power transmission period is allowed to be reduced. Consequently, in the power transmission using a magnetic field, it is possible to reduce power loss caused by the change of the load state.

Further, the operation stop circuit 114 forcibly stops the power transmission when the detected voltage (the voltage $\Delta V2$) exceeds the threshold voltage Vth1, and the power limiting circuit 112 forcibly interrupts the power supply to the power transmission section 110 when the voltage $\Delta V2$ exceeds the threshold voltage Vth2 that is larger than the threshold voltage Vth1. Therefore, for example, even when the power transmission section 110 is in the failed state or in the destructive state, the overcurrent is allowed to be completely stopped, and possibility of the heat generation in the feed unit 1 (the transistor Tr1) is allowed to be avoided. Accordingly, it is possible to improve safety in the power transmission using a magnetic field.

In addition, in the case where the power transmission is performed by the power transmission section 110 with use of resonance operation (LC resonance operation), the following advantage is particularly obtained. Specifically, since resonance operation is acted, the configuration that is insensitive to the variation of the output power and has resistance to instant power interruption or the like is obtained. In other words, even if sudden power variation occurs, the power transmission section 110 is allowed to continue to operate (continue to transmit power) by a so-called "principle of pendulum" (inertia action).

Second Embodiment

Subsequently, a second embodiment of the present disclosure will be described. Note that like numerals are used to designate substantially like components of the above-described first embodiment, and description thereof will be appropriately omitted.

(Configuration of Feed System 4A)

FIG. 10 is a circuit diagram illustrating a configuration example of a main part in a feed system (a feed system 4A) according to the second embodiment. The feed system 4A in the present embodiment has one feed unit 1A and two electronic apparatuses 2A and 2B. The feed unit 1A is configured by providing a power limiting modulation circuit 112A in the feed unit 1 of the first embodiment in place of the power limiting circuit 112, and other configurations are similar to those in the feed unit 1 of the first embodiment. Note that the power limiting modulation circuit 112A corresponds to a specific example of "power limiting section" in the present disclosure.

In this example, as illustrated in FIG. 10, the power limiting modulation circuit 112A has a configuration in which one OR circuit LG2 is further added to the power limiting circuit 112 illustrated in FIG. 3. One of input terminals of the OR circuit LG2 is connected to the output terminal of the error amplifier A3, and the other input terminal receives the modulation data Dm output from the power transmission control section (the modulation processing section) 10A. An output terminal of the OR circuit LG2 is connected to the gate of the transistor Tr1.

(Function and Effects of Feed System 4A)

In the feed unit 1A of the present embodiment, in the power limiting modulation circuit 112A, power limiting operation is performed by a similar method to that by the power limiting circuit 112 of the first embodiment. In addition thereto, in the power limiting modulation circuit 112A, amplitude modulation (AM) operation such as amplitude shift keying (ASK) modulation is performed.

Specifically, for example, as illustrated in FIG. 11, in the power limiting modulation circuit 112A, the power limiting operation is performed during the feeding period Tc, whereas the amplitude modulation operation is performed during the communication period Tc. Further, during the communication period Tc (in a light load state), the power limiting operation of the power limiting modulation circuit 112A is controlled by the power transmission control section 10A, and thus communication by the above-described amplitude modulation is performed. In this way, in the present embodiment, the communication operation by the amplitude modulation such as ASK modulation is achieved relatively easily.

More specifically, during the communication period Tc, for example, as illustrated in (A) to (D) of FIG. 12, the communication operation using the amplitude modulation in the power limiting modulation circuit 112A is performed. In other words, for example, the modulation data Dm illustrated in (A) of FIG. 12 is first supplied from the power transmission control section 10A to the transistor Tr1 through the OR circuit LG2 in the power limiting modulation circuit 112A. As a result, the DC signal Sdc output from the power limiting modulation circuit 112A to the power supply line Lp is a signal subjected to the amplitude modulation, for example, as illustrated in (B) of FIG. 12. Then, the AC signal Sac is generated by the AC signal generation circuit 113 based on such a DC signal Sdc (see (C) of FIG. 12), and the communication operation by the amplitude modulation is finally performed (see (D) of FIG. 12).

By the communication operation by the amplitude modulation using the power limiting operation of the power limiting modulation circuit 112A, for example, the following advantages are obtainable, for example, as compared with the communication operation using pulse width modulation of the AC signal generation circuit 113 described in the first embodiment.

Specifically, for example, as illustrated by a dashed line in (D) of FIG. 6 described above, in the communication by the pulse width modulation, a positive waveform and a negative waveform of the AC signal (in this case, the voltage V(L1) between the both ends of the power transmission coil L1) are different from each other (are asymmetric), and contains so-called even harmonic component (containing second order harmonic). In this example, when the AC signal is demodulated (envelop is detected) by the secondary-side unit, noise of the even harmonic component distorts the communication waveform. Therefore, carrier to noise ratio (C/N ratio) may be deteriorated, and communication quality may be lowered.

In contrast, in the communication by the amplitude modulation, for example, as illustrated by a dashed line in (D) of FIG. 12, a positive waveform and a negative waveform of the AC signal (the voltage V(L1) between the both ends of the power transmission coil L1) are coincident with each other (are symmetric), and contains so-called odd harmonic component. Therefore, the C/N ratio in demodulation of the AC signal (envelope detection) by the secondary-side unit is improved, and thus the communication quality is also improved.

As described above, in the present embodiment, the power limiting operation by the power limiting modulation circuit 112A is controlled during the communication period Tc to perform the communication by the amplitude modulation. Therefore, in addition to the effects of the first embodiment, the communication quality during the communication period Tc is allowed to be improved. In addition, since the power limiting modulation circuit 112A performs both the power limiting operation and the modulation operation (the amplitude modulation operation) (has both functions). Therefore, it is possible to achieve cost reduction of the unit, reduction in the number of mounted components, and size reduction.

(Modification)

As described above, although the technology of the present disclosure has been described with reference to some embodiments, the present technology is not limited to the embodiments, and various modifications may be made.

For example, in the above-described embodiments, various kinds of coils (the power transmission coil and the power reception coil) have been described. However, various kinds of configurations are allowed to be used as the configurations (shapes) of the respective coils. Specifically, for example, each coil may be configured in shapes such as a spiral shape, a loop shape, a bar shape using a magnetic body, an alpha-wound shape configured by folding a spiral coil into two layers, a multilayer spiral shape, a helical shape configured by winding a wire in a thickness direction thereof. Moreover, each coil is not limited to a winding coil configured of a conductive wire rod, and may be a conductive patterned coil configured of a printed board, a flexible printed board, or the like.

In addition, in the above-described embodiments, although the electronic apparatus has been described as an example of a unit to be fed with power, the unit to be fed with power is not limited thereto, and may be other than the electronic apparatus (for example, vehicles such as electric cars).

Furthermore, in the above-described embodiments, the components of each of the feed unit and the electronic apparatuses have been specifically described. However, all of the components are not necessarily provided, and other components may be further provided. For example, in the feed unit or the electronic apparatus, a communication function, a control function, a display function, a function of authenticating a secondary-side unit, a function of determining whether a secondary-side unit is placed on a primary-side unit, a function of detecting a contaminant such as a dissimilar metal, and the like may be provided.

In addition, in the above-described embodiments, mainly, the case where the feed system includes a plurality of (two) electronic apparatuses has been described as an example. However, the number of electronic apparatuses is not limited thereto, and the feed system may include only one electronic apparatus.

Moreover, in the above-described embodiments, the charging tray for a small electronic apparatus (CE device) such as a mobile phone has been described as an example of the feed unit. However, the feed unit is not limited to such a household charging tray, and is applicable as a charging unit for various electronic apparatuses, and the like. In addition, the feed unit is not necessarily a tray, and may be a stand for electronic apparatuses such as a so-called cradle.

(Example of Feed System Performing Non-Contact Power Transmission with Use of Electronic Field)

In addition, in the above-described embodiments, the case of the feed system that performs the non-contact power transmission (power feeding) from the feed unit as the primary-side unit to the electronic apparatus as the secondary-side unit with use of a magnetic field has been described as an example. However, the configuration is not limited thereto. Specifically, the contents of the present disclosure is applicable to a feed system that performs non-contact power transmission from a feed unit as a primary-side unit to an electronic apparatus as a secondary-side unit with use of an electronic field (electronic field coupling), and similar effects to those in the above-described embodiments may be obtained.

More specifically, for example, a feed system illustrated in FIG. 13 may include one feed unit 81 (a primary-side unit) and one electronic apparatus 82 (a secondary-side unit). The feed unit 81 mainly has a power transmission section 810 including a power transmission electrode E1 (a primary-side electrode), an AC signal source 811 (an oscillator), and a ground electrode Eg1. The electronic apparatus 82 mainly has a power reception section 820 including a power reception electrode E2 (a secondary-side electrode), a rectification circuit 821, a load 822, and a ground electrode Eg2. Specifically, the feed system includes two pairs of electrodes, the power transmission electrode E1 and the power reception electrode E2, and the ground electrodes Eg1 and Eg2. In other words, each of the feed unit 81 (the primary-side unit) and the electronic apparatus 82 (the secondary-side unit) has an antenna configured of a pair of asymmetric electrode structures, such as a monopole antenna therein.

In the feed system having such a configuration, when the power transmission electrode E1 and the power reception electrode E2 face each other, the above-described non-contact antennae are coupled with each other (are coupled with each other by an electric field along a vertical direction of the electrodes). Then, the induction field is generated therebetween, and power transmission using the electronic field is accordingly performed (see power P8 illustrated in FIG. 13). More specifically, for example, as schematically illustrated in FIG. 14, the generated electric field (induction field Ei) propagates from the power transmission electrode E1 side to the power reception electrode E2 side, as well as the generated induction field Ei propagates from the ground electrode Eg2 side to the ground electrode Eg1 side. In other words, a loop path of the generated induction field Ei is formed between the primary-side unit and the secondary-side unit. Also in such a non-contact power supply system using the electronic field, similar effects are allowed to be obtained by applying similar method to that in the above-described embodiments.

Note that the present technology may be configured as follows.

(1) A feed unit including:

a power transmission section configured to perform power transmission with use of a magnetic field or an electric field;

a power limiting section provided on a power supply line from an external power source to the power transmission section; and a control section provided on a side closer to the external power source than the power limiting section, and including a power transmission control section, the power transmission control section being configured to control the power transmission.

(2) The feed unit according to (1), wherein the control section includes the power transmission control section and a control section for data transmission.

(3) The feed unit according to (1) or (2), further including an operation stop section that is configured to forcibly stop the power transmission irrespective of power transmission control by the power transmission control section when an abnormal state of the unit is detected.

(4) The feed unit according to (3), wherein the operation stop section renders a control signal for the power transmission invalid to forcibly stop the power transmission.

(5) The feed unit according to (4), wherein the operation stop section has a switching section configured to switch a state of the control signal between valid and invalid according to presence or absence of detection of the abnormal state.

(6) The feed unit according to any one of (3) to (5), wherein the operation stop section has a voltage detection section that is configured to detect a voltage between input and output of the power limiting section, and forcibly stops the power transmission according to magnitude of the voltage detected by the voltage detection section (7) The feed unit according to (6), wherein the operation stop section forcibly stops the power transmission when the detected voltage exceeds a first threshold.

(8) The feed unit according to (7), wherein the power limiting section forcibly interrupts power supply to the power transmission section when the detected voltage also exceeds a second threshold that is larger than the first threshold.

(9) The feed unit according to (8), wherein the power limiting section includes an error amplifier that is configured to control power limiting operation according to a potential difference between a reference voltage and a voltage corresponding to an input current from the external power source, and controls magnitude of the reference voltage to forcibly interrupt the power supply to the power transmission section when the detected voltage exceeds the second threshold.

(10) The feed unit according to (9), wherein the power limiting section includes a transistor on the power supply line, and controls the magnitude of the reference voltage and sets the transistor to be in OFF state to forcibly interrupts the power supply to the power transmission section.

(11) The feed unit according to any one of (8) to (10), wherein
the first threshold defines whether the state of the unit is in a overload state during normal operation, and
the second threshold defines whether the power transmission section is in a failed state or in a destructive state.

(12) The feed unit according to any one of (8) to (11), wherein the operation stop section is in an inoperable state when the detected voltage exceeds the second threshold.

(13) The feed unit according to any one of (3) to (12), wherein
the power transmission control section controls the power transmission to allow a feeding period during which the power transmission is performed on a unit to be fed with power and a communication period during which predetermined communication is performed with the unit to be fed with power, to be set in a time-divisional manner, and
the operation stop section forcibly stops the communication when the abnormal state is detected during the communication period.

(14) The feed unit according to any one of (1) to (13), wherein
the power transmission control section controls the power transmission to allow a feeding period during which the power transmission is performed on a unit to be fed with power and a communication period during which predetermined communication is performed with the unit to be fed with power, to be set in a time-divisional manner, and controls power limiting operation by the power limiting section during the communication period to allow communication by amplitude modulation to be performed.

(15) The feed unit according to (14), wherein the power limiting section performs the power limiting operation during the feeding period, and performs amplitude modification operation during the communication period.

(16) The feed unit according to any one of (1) to (15), further including
an AC signal generation section configured to generate an AC signal to perform the power transmission, wherein
the power transmission control section controls operation of the AC signal generation section to perform control of the power transmission.

(17) The feed unit according to (16), wherein
the AC signal generation section is configured using a switching amplifier including a switching device, and
the power transmission control section uses a control signal for the power transmission to control ON-OFF operation of the switching device.

(18) The feed unit according to (17), wherein the power transmission control section controls the power transmission to allow a feeding period during which the power transmission is performed on a unit to be fed with power and a communication period during which predetermined communication is performed with the unit to be fed with power, to be set in a time-divisional manner, and controls a duty ratio of the control signal during the communication period to allow communication by pulse width modulation to be performed.

(19) The feed unit according to any one of (1) to (18), wherein the power transmission section uses resonance operation to perform the power transmission.

(20) A feed system provided with one or a plurality of electronic apparatuses and a feed unit configured to perform power transmission on the electronic apparatuses, the feed unit including:
a power transmission section configured to perform the power transmission with use of a magnetic field or an electronic field;
a power limiting section provided on a power supply line from an external power source to the power transmission section; and
a control section provided on a side closer to the external power source than the power limiting section, and including a power transmission control section, the power transmission control section being configured to control the power transmission.

This application is based upon and claims the benefit of priority of the Japanese Patent Application No. 2011-231767 filed on Oct. 21, 2011, and the Japanese Patent Application No. 2012-92846 filed on Apr. 16, 2012, both filed with the Japan Patent Office, the entire contents of these applications are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A feed unit, comprising:
a power transmission section configured to transmit power based on one of a magnetic field or an electric field;
a power limiting section on a power supply line from an external power source to the power transmission section,
wherein a portion of an input current from the external power source is transmitted to the power transmission section through the power supply line;
a control section between a power input terminal of the external power source and the power limiting section, wherein the control section includes a power transmission control section configured to control the transmission of the power; and
an operation stop section including a voltage detection section,
wherein the voltage detection section is configured to:
detect a voltage between an input and an output of the power limiting section, and
stop the transmission of the power irrespective of the control by the power transmission control section, based on a magnitude of the detected voltage.

2. The feed unit according to claim 1, wherein the control section is further configured to transmit.

3. The feed unit according to claim 1, wherein the operation stop section is further configured to:
detect an abnormal state of the feed unit; and
stop the transmission of the power based on the detected abnormal state of the feed unit.

4. The feed unit according to claim 3, wherein the operation stop section is further configured to render a control signal, corresponding to an invalid state of the transmission of the power, to further stop the transmission of the power.

5. The feed unit according to claim 4,
wherein the operation stop section includes a switching section, wherein the switching section is configured to switch a state of the control signal between a valid state and the invalid state based on one of a presence or an absence of the abnormal state.

6. A feed unit, comprising:
a power transmission section configured to transmit a first power based on one of a magnetic field or an electric field;
a power limiting section on a power supply line from an external power source to the power transmission section;
a control section between a power input terminal of the external power source and the power limiting section, wherein the control section includes a power transmission control section configured to control the transmission of the first power; and
an operation stop section including a voltage detection section,
wherein the voltage detection section is configured to:
detect a first voltage between an input and an output of the power limiting section, and
stop the transmission of the first power irrespective of the control by the power transmission control section, based on a magnitude of the first voltage.

7. The feed unit according to claim 6,
wherein the operation stop section is further configured to stop the transmission of the first power based on the first voltage that exceeds a first threshold.

8. The feed unit according to claim 7,
wherein the power limiting section is further configured to interrupt a second power supplied to the power transmission section,
wherein the interruption is based on the first voltage that exceeds a second threshold, and
wherein the second threshold is larger than the first threshold.

9. The feed unit according to claim 8,
wherein the power limiting section includes an error amplifier, and
wherein the error amplifier is configured to:
control a power limiting operation, based on a potential difference between a reference voltage and a second voltage, wherein the second voltage corresponds to a portion of an input current, and wherein the input current is transmitted from the external power source to the power transmission section, and
control a magnitude of the reference voltage to interrupt the second power supplied to the power transmission section, wherein the control of the magnitude is based on the first voltage that exceeds the second threshold.

10. The feed unit according to claim 9,
wherein the power limiting section further includes a transistor on the power supply line, and
wherein the power limiting section is configured to:
control the magnitude of the reference voltage, and
set the transistor to an OFF state to interrupt the second power supplied to the power transmission section.

11. The feed unit according to claim 8,
wherein the first threshold defines that the feed unit is in an overload state, and
wherein the second threshold defines that the power transmission section is in one of a failed state or a destructive state.

12. The feed unit according to claim 8, wherein the operation stop section is in an inoperable state based on the first voltage that exceeds the second threshold.

13. The feed unit according to claim 3,
wherein the power transmission control section is further configured to control the transmission of the power to allow a feeding period and a communication period to be set in a time-divisional manner,
wherein the feeding period corresponds to a first time period in which the power is transmitted to a reception unit,
wherein the communication period corresponds to a second time period in which the power transmission section communicates with the reception unit, and
wherein the operation stop section is further configured to stop the communication based on the abnormal state detected in the communication period.

14. The feed unit according to claim 1, wherein
the power transmission control section is further configured to control the transmission of the power to allow a feeding period during which the power is transmitted to a unit and a communication period during which communication is performed with the unit, to be set in a time-divisional manner, and controls a power limiting operation by the power limiting section during the communication period to allow communication by amplitude modulation.

15. The feed unit according to claim 14, wherein the power limiting section is further configured to control the power limiting operation during the feeding period, and control an amplitude modification operation during the communication period.

16. The feed unit according to claim 1, further comprising an AC signal generation section configured to generate an AC signal to transmit the power, wherein
the power transmission control section is further configured to control an operation of the AC signal generation section to control the transmission of the power.

17. The feed unit according to claim 16, wherein
the AC signal generation section comprises a switching amplifier, wherein the switching amplifier comprises a switching device, and
the power transmission control section is further configured to control, based on a control signal for the transmission of the power, an ON-OFF operation of the switching device.

18. The feed unit according to claim 17, wherein the power transmission control section is further configured to control the transmission of the power to allow a feeding period during which the power is transmitted to a unit and a communication period during which communication is performed with the unit, to be set in a time-divisional manner, and controls a duty ratio of the control signal during the communication period to allow communication by pulse width modulation.

19. The feed unit according to claim 1, wherein the power transmission section is further configured to transmit the power based on a resonance operation.

20. A feed system, comprising:
at least one electronic apparatus; and
a feed unit configured to transmit power on the at least one electronic apparatus, wherein the feed unit comprising:
a power transmission section configured to transmit the power based on one of a magnetic field or an electronic field;
a power limiting section on a power supply line from an external power source to the power transmission section, wherein a portion of an input current from the external power source is transmitted to the power transmission section through the power supply line;
a control section between a power input terminal of the external power source and the power limiting section, wherein the control section includes a power transmission control section configured to control the transmission of the power; and
an operation stop section including a voltage detection section,
wherein the voltage detection section is configured to:
detect a voltage between an input and an output of the power limiting section, and
stop the transmission of the power irrespective of the control by the power transmission control section, based on a magnitude of the detected voltage.

21. A feed unit, comprising:
a power transmission section configured to transmit power based on one of a magnetic field or an electric field;
a power limiting section on a power supply line from an external power source to the power transmission section, wherein a portion of an input current from the external power source is transmitted to the power transmission section through the power supply line;
a control section between a power input terminal of the external power source and the power limiting section, wherein the control section includes a power transmission control section configured to:
control the transmission of the power to allow a feeding period and a communication period to be set in a time-divisional manner,
wherein the feeding period corresponds to a first time period in which the power is transmitted to a reception unit, and
wherein the communication period corresponds to a second time period in which the power transmission section communicates with the reception unit; and
an operation stop section configured to:
detect an abnormal state of the feed unit, and
stop the communication based on the abnormal state detected in the communication period.

* * * * *